United States Patent [19]

Kondow et al.

[11] 4,328,150

[45] May 4, 1982

[54] CURABLE EPOXY RESIN COMPOSITIONS

[75] Inventors: Kiyohiro Kondow; Tetuo Yoshida; Yuki Tateyama, all of Annaka, Japan

[73] Assignee: Shin-Etsu Chemical Co., Ltd., Tokyo, Japan

[21] Appl. No.: 243,251

[22] Filed: Mar. 12, 1981

[30] Foreign Application Priority Data

Mar. 17, 1980 [JP] Japan .................................. 55-33602

[51] Int. Cl.³ ............................................. C08L 63/00
[52] U.S. Cl. ...................................... 523/400; 528/89
[58] Field of Search .................................... 260/37 EP

[56] References Cited

U.S. PATENT DOCUMENTS 2,768,153 10/1956 Shokal ............................ 260/18 PF
3,759,866 9/1973 Rogers, Jr. et al. ............ 260/37 EP

*Primary Examiner*—Lewis T. Jacobs
*Attorney, Agent, or Firm*—Toren, McGeady & Stanger

[57] ABSTRACT

The invention provides a novel epoxy-based curable resin composition suitable for encapsulation of electronic devices such as transistors, ICs, LSIs and the like. The composition comprises an epoxy compound, a novolac-type phenolic resin as the curing agent, an organophosphine compound such as triphenylphosphine and trilaurylphosphine as a curing accelerator and an inorganic filler. The advantages obtained by the combined use of the novolac-type phenolic resin and the organophosphine compound are very specific and the resin composition is imparted with remarkable flowability in molding and stability in storage in addition to the excellent electric properties at high temperatures and anti-moisture resistance of the cured shaped articles molded therefrom.

5 Claims, No Drawings

CURABLE EPOXY RESIN COMPOSITIONS

BACKGROUND OF THE INVENTION

The present invention relates to a curable epoxy resin composition or, more particularly, to a curable epoxy resin composition suitable for encapsulating electronic devices such as semiconductor-based ones, e.g. transistors, ICs (integrated circuits), LSIs (large-scale integrated circuits) and the like.

Epoxy resin-based molding compositions have found wide applications in a variety of industrial fields and, in particular, they are useful materials in the electronics industry owing to their excellent heat curability, electric properties and adhesive bonding strength in addition to the inexpensiveness in comparison with the other kinds of thermosetting resin-based molding compositions. In particular, epoxy resin-based molding compositions in general exhibit sufficient flow even under a relatively low pressure in the molding so that they are advantageously used in encapsulating various kinds of electronic devices or semiconductor devices such as transistors, ICs, LSIs and the like without injuring the devices by the techniques of low-pressure transfer molding to give high productivity.

Needless to say, these epoxy resin-based molding compositions are formulated with a curing agent and typical curing agents include anhydrides of carboxylic acids, aromatic amine compounds, novolac-type phenolic resins and the like with their respective advantages and disadvantages. In particular, epoxy resin-based molding compositions formulated with a novolac-type phenolic resin are advantageous in respects of excellent moldability and anti-moisture resistance in addition to the outstanding inexpensiveness and absence of toxicity when compared with the compositions formulated with the other kinds of the curing agents so that they are the most widely used resin compositions for encapsulation of semiconductor devices.

One of the disadvantages to the contrary in the epoxy resin-based molding compositions formulated with a novolac-type phenolic resin is the poor electric properties of the cured products thereof at elevated temperatures. For example, a MOS type semiconductor device having a relatively high working temperature of 80° C. or higher sometimes works wrongly exhibiting no normal performance of the semiconductor when encapsulated with the epoxy resin composition of this type due to the increased leak current between the electrodes. Further, ICs encapsulated with the resin composition are defective because breaking of the wiring in the chips takes place at a relatively early stage when they are used at a high temperature and under a high humidity by the corrosion of the aluminum wires used for the wiring.

Therefore, one of the most important problems in the technology of the encapsulation of semiconductor devices by use of a resin composition is the improvement of the high temperature performance of the epoxy resin-based compositions formulated with a novolac-type phenolic resin as the curing agent.

SUMMARY OF THE INVENTION

It is therefore an object of an present invention to provide a novel and improved epoxy resin-based curable composition formulated with a novolac-type phenolic resin as the curing agent which is free from the above described problems of poor performance at high temperatures in the prior art compositions.

The epoxy resin-based curable composition of the present invention comprises (a) an epoxy compound having at least two epoxy groups per molecule, (b) a novolac-type phenolic resin in an amount sufficient to give from 0.5 to 4.0 moles of the phenolic hydroxy groups per mole of the epoxy groups in the epoxy compound as the component (a), (c) an organophosphine compound in an amount sufficient to give from 0.04 to 0.59 parts by weight of phosphorus per 100 parts by weight of the total amount of the epoxy compound as the component (a) and the novolac-type phenolic resin as the component (b), and (d) an inorganic filler in an amount from 50 to 500 parts by weight per 100 parts by weight of the total amount of the epoxy compound as the component (a) and the novolac-type phenolic resin as the component (b).

By virtue of the use of an organophosphine compound as a curing accelerator, the curable resin composition of the invention has excellent curing performance as well as good workability in molding and long-term storage stability and can give cured products, such as in encapsulation of semiconductor devices, imparted with excellent electric properties at elevated temperatures and anti-moisture resistance and freed from the drawbacks of breaking of aluminum wiring by corrosion even when they are used prolongedly at a high temperature and under a high humidity over a period of 1000 hours or longer.

DETAILED DESCRIPTION OF THE PREFERRED EMBODIMENTS

The epoxy compound as the base ingredient in the inventive curable resin composition is well known in the art and it is not particularly limitative with respect to the molecular structure and molecular weight provided that at least two epoxy groups are contained in a molecule. Several examples of the epoxy compounds suitable as the component (a) are: a diglycidyl ether of 2,2-bis(4-hydroxyphenyl)propane or a halogenated product thereof; butadiene diepoxide; vinylcyclohexene dioxide; diglycidyl ether of resorcin; 1,4-bis(2,3-epoxypropoxy)benzene; 4,4'-bis (2,3-epoxypropoxy)diphenyl ether; 1,4-bis(2,3-epoxypropoxy)cyclohexene; bis(3,4-epoxy-6-methylcyclohexylmethyl) adipate; condensation products of epichlorohydrin and catechol, resorcin or other polyvalent phenols; condensation products of epichlorohydrin and a polyvalent alcohol; epoxy novolacs as a condensation product of epichlorohydrin and a novolac-type phenolic resin or a halogenated product thereof; epoxidated polyolefins obtained by the peroxide method; epoxidated polybutadienes and epoxidated novolac resins represented by the structural formula

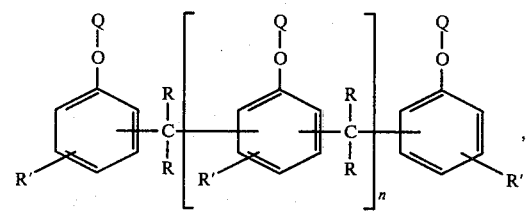

in which R is an alkyl group, R' is a hydrogen atom, halogen atom or an alkyl group, Q is a glycidyl group and n is a positive integer.

Needless to say, the above named epoxy compounds may be used either alone or as a combination of two kinds or more according to need.

In addition to the above described epoxy compound as the component (a) which is a di- or polyepoxy compund, the inventive resin composition may contain, if desired, one or more of monoepoxy compounds as a reaction moderator in an amount of up to a few percents of the composition. The monoepoxy compounds suitable for such a purpose are exemplified by styrene oxide, cyclohexene oxide, propylene oxide, methyl glycidyl ether, allyl glycidyl ether, ethyl glycidyl ether, phenyl glycidyl ether, octylene oxide, dodecene oxide and the like.

In the next place, the novolac-type phenolic resins as the component (b) in the inventive composition are also well known in the art. The novolac-type phenolic resins include acid-catalyzed condensation products of formaldehyde or paraformaldehyde with a phenolic compound such as phenol, cresol, xylenol and the like, modified novolac resins such as butylated novolac-type phenolic resins and the resins represented by the structural formula

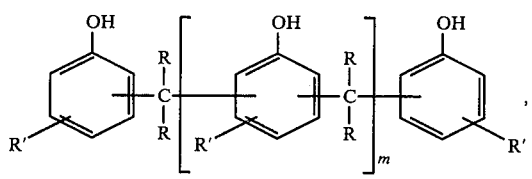

in which R is an alkyl group, R' is a hydrogen atom, halogen atom or an alkyl group and m is a positive integer.

The amount of the component (b) to be formulated in the inventive composition is necessarily such that from 0.5 to 4.0 moles of the phenolic hydroxy groups are given in the component (b) per mole of the epoxy groups in the component (a). When the amount of the phenolic resin is smaller than above, the resultant composition has unsatisfactory curing performance and moldability and the cured products obtained therefrom have poor electric properties at an elevated temperature. When the amount of the phenolic resin is in excess over the above range, the composition also has poor moldability and the electric properties of the cured products are also inferior.

The component (c) in the inventive resin composition is an organophosphine compound including primary phosphines, secondary phosphines and tertiary phosphines represented by the general formula $R^1{}_aH_{3-a}P$, in which $R^1$ is a hydrocarbyl group such as alkyl and aryl groups and a is an integer of 1, 2 or 3. Particular examples of the organophosphine compounds are: ethylphosphine; propylphosphine; butylphosphine; long-chained alkylphosphines, phenylphosphine; dimethylphosphine; diethylphosphine; dipropylphosphine; diamylphosphine; dialkylphosphines of which at least one of the alkyl groups is a long-chained alkyl group; diphenylphosphine; methylphenylphosphine; ethylphenylphosphine; trimethylphosphine; triethylphosphine; tributylphosphine; trialkylphosphines of which at least one of the alkyl groups is a long-chained alkyl group; triphenylphosphine; alkyldiphenylphosphines; dialkylphenylphosphines and the like. Among the above named organophosphine compounds, the tertiary organophosphine compounds are in general preferred to the primary and secondary compounds. It is of course optional that two kinds or more of the organophosphine compounds are used in combination.

The combined use of the above organophosphine compound with the novolac-type phenolic resin as the component (b) is effective in improving the curing performance and the storage stability of the resin composition as well as the electric properties at a high temperature and anti-moisture resistance of the cured products obtained therefrom simultaneously. The amount of the organophosphine compound should be such that from 0.04 to 0.5 part by weight of phosphorus is given per 100 parts by weight of the total amount of the components (a) and (b) in order to fully obtain the desired effects by the combined use of the components (b) and (c). When the amount of the organophosphine compound is smaller than above, the resin composition has no adequate curability while an excessive amount of the organophosphine compound is detrimental due to the poor storage stability of the resin composition and inferior electric properties at a high temperature and anti-moisture resistance of the cured products obtained therefrom.

It should be noted that the above mentioned effects are obtained specifically by the combined use of the novolac-type phenolic resin as the curing agent and the organophosphine compound as the curing accelerator. That is, the combined use of the organophosphine compound with a curing agent of a different type can never give the desired effects. For example, the anti-moisture resistance and the electric properties of the cured products at a high temperature are inferior when the organophosphine compound is used in combination with an anhydride of a carboxylic acid or an aromatic amine compound. In particular, no sufficient anti-moisture resistance is obtained with acid anhydrides whereas the combined use of an aromatic amine compound is undesirable both in the anti-moisture resistance and electric properties of the cured products at a high temperature.

Further, replacement of the organophosphine compound with other kinds of known curing accelerators also results in unsatisfactory results. For example, the resin compositions have no adequate curability suitable for encapsulation when a secondary amine compound, boron fluoride, phosphonium compound or metal chelate compound is used as the curing accelerator in place of the organophosphine compound due to their poorer power for curing acceleration. Similarly, the use of a tertiary amine compound, e.g. benzyl dimethylamine, tris-(dimethylaminomethyl)phenol, piperidine and the like results in poor anti-moisture resistance of the cured products at high temperatures and a tetra-substituted phosphonium compound, tetra-substituted borate compound or imidazole derivative in place of the organophosphine compound can never give a cured product having good electric properties, in particular, volume resistivity, at high temperatures. Thus, the combination of the novolac-type phenolic resin and the organophosphine compound is very specific and unexpected.

The inorganic filler as the componet (d) in the inventive resin composition is selected from a diversity of known ones used conventionally in epoxy resin-based molding compositions including finely divided silica, alumina, glass fiber, glass beads, asbestos, mica powder, clay, talc, titanium dioxide, calcium carbonate and the like. In particular, finely divided silica, high-purity alumina, glass fibers and the like are preferred. The average particle diameter of powdery fillers should desirably not exceed 100 μm.

The amount of the inorganic filler is preferably in the range from 50 to 500 parts by weight or, more preferably, from 150 to 400 parts by weight per 100 parts by weight of the total amount of the components (a) and (b).

The resin composition of the invention may contain, if desired, other additive ingredients such as mold-release agents or lubricants, e.g. waxes, stearic acid and other fatty acids and metal salts thereof and the like, coloring agents, e.g. dyes and pigments, flame retardants, surface-treating agents, e.g. 3-glycidyloxypropyl trimethoxysilane and the like, aging retarders and others.

The resin composition of the invention is readily prepared by uniformly blending the above described components (a) to (b) and other optional ingredients in a suitable blending machine conventionally used in the art of rubber or plastic processing such as a roller mill, kneader and the like. The sequential order of blending of the components is not particularly limitative.

The epoxy resin-based curable composition of the present invention is shaped into cured articles by molding in any procedure suitable for the molding fabrication of thermosetting resin compositions such as compression molding, injection molding, transfer molding and the like. The heating temperature of curing is preferably in the range such that satisfactorily rapid curing of the composition achieved within several minutes.

In the following, the present invention is described in further detail by way of examples. In the following description, the amounts of the components are given merely by parts instead of parts by weight.

In the examples described below, testing was conducted both with the resin compositions and the cured shaped articles obtained therefrom. The testing procedures were as follows.

Spiral flow test: a metal mold specified in EMMI was used and the test was performed at a molding temperature of 160° C. under a molding pressure of 70 kg/cm². The results are given in inches.

Barcol hardness: test pieces were prepared by molding for 2 minutes at 160° C. under a pressure of 70 kg/cm² and the hardness of the product as molded was determined with the Barcol hardness of 935.

Volume resistivity: test pieces of a disc form of 6 cm diameter and 2 mm thickness were prepared under the same molding conditions as in the test of Barcol hardness followed by postcuring at 180° C. for 4 hours. Measurement was conducted according to JIS K 6911 at 100° C. and at 150° C.

Anti-moisture resistance: the test piece prepared in the same manner as above was kept in steam at 120° C. for 150 hours and then subjected to the measurements of the dielectric constant and dielectric tangent at 60 Hz according to JIS K 1911.

Appearance of the shaped body: the test piece prepared in the same manner as above was examined visually to detect blisters and voids.

Storage stability: the resin composition was kept for 32 hours at 40° C. and then subjected to the spiral flow test.

EXAMPLE 1

(Experiments No. 1 to No. 13)

In Experiments No. 1 to No. 8, two kinds of epoxy compounds (a-1) and (a-2) and a novolac-type phenolic resin (b-1), the amount of the compound (a-2) always being 10 parts and the total amount of (a-1), (a-2) and (b-1) always being 100 parts, were blended together with 200 parts of a quartz powder having an average particle diameter of about 10 μm, 5 parts of antimony oxide, 1 part of carnauba wax, 0.8 part of 3-glycidyloxypropyl trimethoxysilane, 1 part of carbon black and 1 part of triphenylphosphine containing 0.118 part of phosphorus in a two-roller mill of 8 inch diameter heated in advance at 70° to 95° C. for 10 minutes into a uniform mass, which was then cooled and pulverized into a powdered epoxy resin-based curable resin composition.

The components (a-1), (a-2) and (b-1) were each a commercially available product given below and the amounts of the components (a-1) and (b-1) in parts as well as the molar ratio of the epoxy groups in the components (a-1) and (a-2) to the phenolic hydroxy groups in the component (b-1) in each of the formulations are given in Table 1 below.

Component (a-1): a commerical product of a cresol novolac epoxy resin (ECN 1280, a product by CIBA Corp.) having an epoxy equivalent of 230.

Component (a-2): a commerical product of diglycidyl ether of brominated bisphenol A (Araldite 8011SP, a product by CIBA Corp.) having an epoxy equivalent of 500.

Component (b-1): a commerical product of phenol novolac resin (MP 120, a product by Gunei Kagaku Co.) having a phenol equivalent of 108.

The results of testing are summarized in Table 1 below.

In Experiments No. 9 to 10 undertaken for comparative purpose, the experimental procedure was substantially the same as in the above except that the component (b-1) was replaced in Experiments No. 9, No. 10, No. 12 and No. 13 either by tetrahydrophthalic anhydride or diaminophenylmethane and 1 part of triphenylphosphine was replaced with 0.75 part of 2-phenylimidazole in Experiments No. 9 to No. 11.

The formulations and the results of testing are summarized in Table 2 below.

TABLE 1

| Experiment No. | 1 | 2 | 3 | 4 | 5 | 6 | 7 | 8 |
|---|---|---|---|---|---|---|---|---|
| Component (a-1) taken, parts | 42 | 46 | 53 | 60 | 66 | 70 | 76 | 81 |
| Component (b-1) taken, parts | 48 | 44 | 37 | 30 | 24 | 20 | 14 | 9 |
| Molar ratio of (epoxy)/(hydroxy) | 0.46 | 0.54 | 0.73 | 1.01 | 1.38 | 1.75 | 2.69 | 4.48 |
| Spiral flow, inches | 15 | 20 | 25 | 30 | 39 | 40 | 41 | 60 |
| Barcol hardness | 0–5 | 40–50 | 55–60 | 60–70 | 67–72 | 70–80 | 70–72 | 50–60 |
| Volume resistivity, at 100° C. ohm-cm | $0.3 \times 10^{14}$ | $1.0 \times 10^{14}$ | $1.86 \times 10^{14}$ | $6.87 \times 10^{14}$ | $1.0 \times 10^{15}$ | $2.0 \times 10^{15}$ | $2.0 \times 10^{15}$ | $1.0 \times 10^{15}$ |
| at 150° C. | $0.5 \times 10^{12}$ | $2.0 \times 10^{12}$ | $4.0 \times 10^{12}$ | $1.37 \times 10^{13}$ | $1.8 \times 10^{13}$ | $2.0 \times 10^{13}$ | $1.6 \times 10^{13}$ | $8.0 \times 10^{12}$ |
| Anti-moisture Dielectric constant | 4.5 | 4.4 | 4.3 | 4.3 | 4.4 | 4.5 | 4.5 | 4.6 |

TABLE 1-continued

| Experiment No. | | 1 | 2 | 3 | 4 | 5 | 6 | 7 | 8 |
|---|---|---|---|---|---|---|---|---|---|
| resistance | Dielectric tangent | $20.0 \times 10^{-3}$ | $13.2 \times 10^{-3}$ | $10.0 \times 10^{-3}$ | $10.5 \times 10^{-3}$ | $11.0 \times 10^{-3}$ | $12.0 \times 10^{-3}$ | $13.0 \times 10^{-3}$ | $14.5 \times 10^{-3}$ |
| Appearance of shaped article | | Fair | Good | Good | Good | Good | Good | Good | Fair |

TABLE 2

| Experiment No. | 9 | 10 | 11 | 12 | 13 |
|---|---|---|---|---|---|
| Component (a-1) taken, parts | 52 | 62 | 60 | 52 | 62 |
| Component (b-1) taken, parts | — | — | 30 | — | — |
| Tetrahydrophthalic anhydride taken, parts | 39 | — | — | 39 | — |
| Diaminophenyl-methane taken, parts | — | 28 | — | — | 28 |
| Triphenylphosphine taken, parts | — | — | — | 1 | 1 |
| 2-Phenylimidazole taken, parts | 0.75 | 0.75 | 0.75 | — | — |
| Spiral flow, inches | 47 | 15 | 30 | 47 | 16 |
| Volume resistivity, ohm-cm at 100° C. | $2.0 \times 10^{14}$ | $2.2 \times 10^{14}$ | $2.0 \times 10^{14}$ | $3.0 \times 10^{14}$ | $3.2 \times 10^{14}$ |
| Volume resistivity, ohm-cm at 150° C. | $6.0 \times 10^{12}$ | $3.0 \times 10^{12}$ | $2.2 \times 10^{12}$ | $9.0 \times 10^{12}$ | $2.2 \times 10^{12}$ |
| Anti-moisture resistance Dielectric constant | 4.5 | 4.4 | 4.4 | 4.5 | 4.5 |
| Anti-moisture resistance Dielectric tangent | $4.31 \times 10^{-3}$ | $17.0 \times 10^{-3}$ | $16.0 \times 10^{-3}$ | $30.2 \times 10^{-3}$ | $17.0 \times 10^{-3}$ |
| Appearance of shaped article | Blistering | Good | Good | slight blistering | Good |

Experiment No. 24: boron trifluoride-monoethylamine adduct
Experiment No. 25: diisopropyl phosphite
Experiment No. 26: acetylacetonato cobalt
Experiment No. 27: tetra-substituted phosphonium tetra-substituted borate

TABLE 3

| Experiment No. | 14 | 15 | 16 | 17 | 18 | 19 | 20 |
|---|---|---|---|---|---|---|---|
| Triphenylphosphine taken, parts | 0.3 | 0.5 | 0.8 | 1.0 | 2.0 | 3.0 | 5.0 |
| (as phosphorus, parts) | (0.035) | (0.059) | (0.094) | (0.118) | (0.236) | (0.354) | (0.59) |
| Spiral flow, inches, initial | 50 | 40 | 35 | 27 | 24 | 13 | 12 |
| Spiral flow, inches, after storage | 50 | 40 | 30 | 20 | 13 | 5.2 | 3 |
| (% retention of the initial value) | (100) | (100) | (86) | (74) | (54) | (40) | (25) |
| Barcol hardness | 0 | 5–10 | 25–45 | 75–80 | 82–86 | 86–90 | 86–90 |
| Volume resistivity, ohm-cm at 100° C. | $15 \times 10^{15}$ | $1.2 \times 10^{15}$ | $9.22 \times 10^{14}$ | $6.87 \times 10^{14}$ | $4.50 \times 10^{14}$ | $3.0 \times 10^{14}$ | $1.0 \times 10^{14}$ |
| at 150° C. | $7 \times 10^{13}$ | $3 \times 10^{13}$ | $1.96 \times 10^{13}$ | $1.37 \times 10^{13}$ | $1.00 \times 10^{13}$ | $0.80 \times 10^{13}$ | $0.3 \times 10^{12}$ |
| Anti-moisture resistance Dielectric constant | 4.3 | 43 | 4.3 | 4.4 | 4.4 | 4.5 | 4.7 |
| Anti-moisture resistance Dielectric tangent | $8.0 \times 10^{-3}$ | $8.0 \times 10^{-3}$ | $10.5 \times 10^{-3}$ | $10.5 \times 10^{-3}$ | $10.5 \times 10^{-3}$ | $13.0 \times 10^{-3}$ | $15.0 \times 10^{-3}$ |

TABLE 4

| Experiment No. | 21 | 22 | 23 | 24 | 25 | 26 | 27 |
|---|---|---|---|---|---|---|---|
| Curing accelerator taken, parts | 1 | 1 | 1 | 3 | 5 | 5 | 5 |
| Spiral flow, inches | 19 | 20 | 20 | * | * | * | 25 |
| Volume resistivity, ohm-cm at 100° C. | $5.0 \times 10^{14}$ | $4.0 \times 10^{14}$ | $6.0 \times 10^{14}$ | * | * | * | $2.0 \times 10^{14}$ |
| Volume resistivity, ohm-cm at 150° C. | $6.0 \times 10^{12}$ | $5.0 \times 10^{12}$ | $5.0 \times 10^{12}$ | * | * | * | $2.1 \times 10^{12}$ |
| Anti-moisture resistance Dielectric constant | 4.3 | 4.5 | 4.3 | * | * | * | 4.3 |
| Anti-moisture resistance Dielectric tangent | $40.0 \times 10^{-3}$ | $41.2 \times 10^{-3}$ | $30.0 \times 10^{-3}$ | * | * | * | $20.0 \times 10^{-3}$ |

*No good molded article was obtained due to the poor curability.

EXAMPLE 2

(Experiments No. 14 to No. 27)

The formulations and the experimental conditions in Experiments No. 14 to No. 20 were substantially the same as in Experiment No. 4 of the preceding example except that the amount of the quartz powder was increased to 300 parts and the amount of triphenylphosphine was varied as indicated in Table 3 below. The storage stability of the resin composition was evaluated by the ratio of the spiral flow after storage for 32 hours at 40° C. to the spiral flow of the same composition as prepared.

For comparison, triphenylphosphine in Experiment No. 4 was omitted in Experiments No. 21 to No. 27 and, instead, one of the following compounds was formulated as the curing accelerator in each of the Experiments in the amount indicated in Table 4 below.
Experiment No. 21: benzyl dimethylamine
Experiment No. 22: tris(dimethylaminomethyl)phenol
Experiment No. 23: piperdine

EXAMPLE 3

(Experiment No. 28)

An epoxy resin-based curable composition was prepared by uniformly blending the ingredients given below in a hot roller mill in the same manner as in the preceding examples followed by cooling and crushing into a particulate resin composition.

| | |
|---|---|
| Cresol novolac epoxy resin (ECN 1273, a product by CIBA Corp.) having an epoxy equivalent of 225 | 60 parts |
| Phenol novolac resin (MP 120, a product by Gunei Kagaku Co.) | 30 parts |
| Epoxidated product of brominated phenol novolac resin (BREN, a product by Nitto Kayaku Co.) having an epoxy equivalent of 286 | 10 parts |
| Alumina powder having an average particle diameter of 30 μm | 200 parts |
| Quartz powder having an average particle diameter of 5 μm | 200 parts |
| Glass fiber of 1.3 μm diameter chopped in 5 mm | 50 parts |
| Antimony oxide | 5 parts |
| Montanic acid wax | 1 part |
| 3-Glycidyloxypropyl trimethoxysilane | 0.8 part |
| Carbon black | 1 part |

| -continued | |
|---|---|
| Trilaurylphosphine | 2 parts |

In the above formulation, the molar ratio of the epoxy groups in the epoxy compounds to the hydroxy groups in the phenol novolac resin was about 1.1 and 2 parts of the trilaurylphosphine contained about 0.115 part of phosphorus.

The thus prepared curable epoxy resin composition was subjected to the same testing procedures as in the preceding examples to give the results given below.

Barcol hardness: 50–60
Volume resistivity at 100° C.: $7.0 \times 10^{14}$ ohm-cm
Volume resistivity at 150° C.: $3.0 \times 10^{13}$ ohm-cm
Dielectric constant in anti-moisture test: 4.3
Dielectric tangent in anti-moisture test: $10.5 \times 10^{-3}$ As is demonstrated by the above given experimental results, trilaurylphosphine in substitution for triphenylphosphine was equally effective to give a cured article having excellent electric properties at high temperatures and anti-moisture resistance.

What is claimed is:

1. A curable epoxy resin composition which comprises
   (a) an epoxy compound having at least two epoxy groups per molecule,
   (b) a novolac-type phenolic resin in an amount sufficient to give from 0.5 to 4.0 moles of the phenolic hydroxy groups per mole of the epoxy groups in the epoxy compound as the component (a),
   (c) an organophosphine compound in an amount sufficient to give from 0.04 to 0.50 part by weight of phosphorus per 100 parts by weight of the total amount of the epoxy compound as the component (a) and the novolac-type phenolic resin as the component (b), and
   (d) an inorganic filler in an amount from 50 to 500 parts by weight per 100 parts by weight of the total amount of the epoxy compound as the component (a) and the novolac-type phenolic resin as the component (b).

2. The curable epoxy resin composition as claimed in claim 1 wherein the organophosphine compound is represented by the general formula $R^1{}_a H_{3-a} P$, in which $R^1$ is an alkyl or an aryl group and a is an integer of 1, 2 or 3.

3. The curable epoxy resin composition as claimed in claim 2 wherein the organophosphine compound is a tertiary phosphine compound represented by the general formula $R^1{}_3 P$.

4. The curable epoxy resin composition as claimed in claim 3 wherein the tertiary phosphine compound is triphenylphosphine.

5. The curable epoxy resin composition as claimed in claim 3 wherein the tertiary phosphine compound is trilaurylphosphine.

* * * * *